United States Patent
Markowski

[11] Patent Number: 5,556,532
[45] Date of Patent: Sep. 17, 1996

[54] MANUFACTURE OF A MULTILAYER LAMINATE

[75] Inventor: Joachim Markowski, Geldern, Germany

[73] Assignee: Hans Höllmüller Maschinenbau GmbH & Co., Herrenberg, Germany

[21] Appl. No.: 333,991

[22] Filed: Nov. 2, 1994

[30] Foreign Application Priority Data

Nov. 6, 1993 [DE] Germany ............... 43 37 988.5

[51] Int. Cl.⁶ .................................................. C25F 5/00
[52] U.S. Cl. .................... 205/705; 205/709; 205/229; 205/220; 205/223
[58] Field of Search .................. 204/141.5; 427/96; 205/229, 220, 223, 705, 709

[56] References Cited

U.S. PATENT DOCUMENTS 4,902,551  2/1990  Nakaso et al. ............... 428/137
5,382,333  1/1995  Ando et al. .................. 204/130

FOREIGN PATENT DOCUMENTS 2851510  11/1978  Germany.

*Primary Examiner*—Arun S. Phasge
*Attorney, Agent, or Firm*—Lowe, Price, LeBlanc & Becker

[57] ABSTRACT

Black- or brown-oxidised copper laminates that are to be integrated into an electrical multilayer laminate in a subsequent process step are electrochemically reduced in order to avoid the formation of so-called "pink rings". To that end, they are connected as the cathode of an electrolysis in a suitable electrolyte. The atomic hydrogen produced in statu nascendi during the electrolysis completely or partially reduces the copper oxide layer on the metallic regions of the copper laminates, whereby the resistance of the surfaces of the metallic regions of the copper laminates to subsequent acid attack is considerably improved. The electrochemical reduction may optionally be coupled with a chemical reduction or precede a chemical reduction.

21 Claims, 1 Drawing Sheet

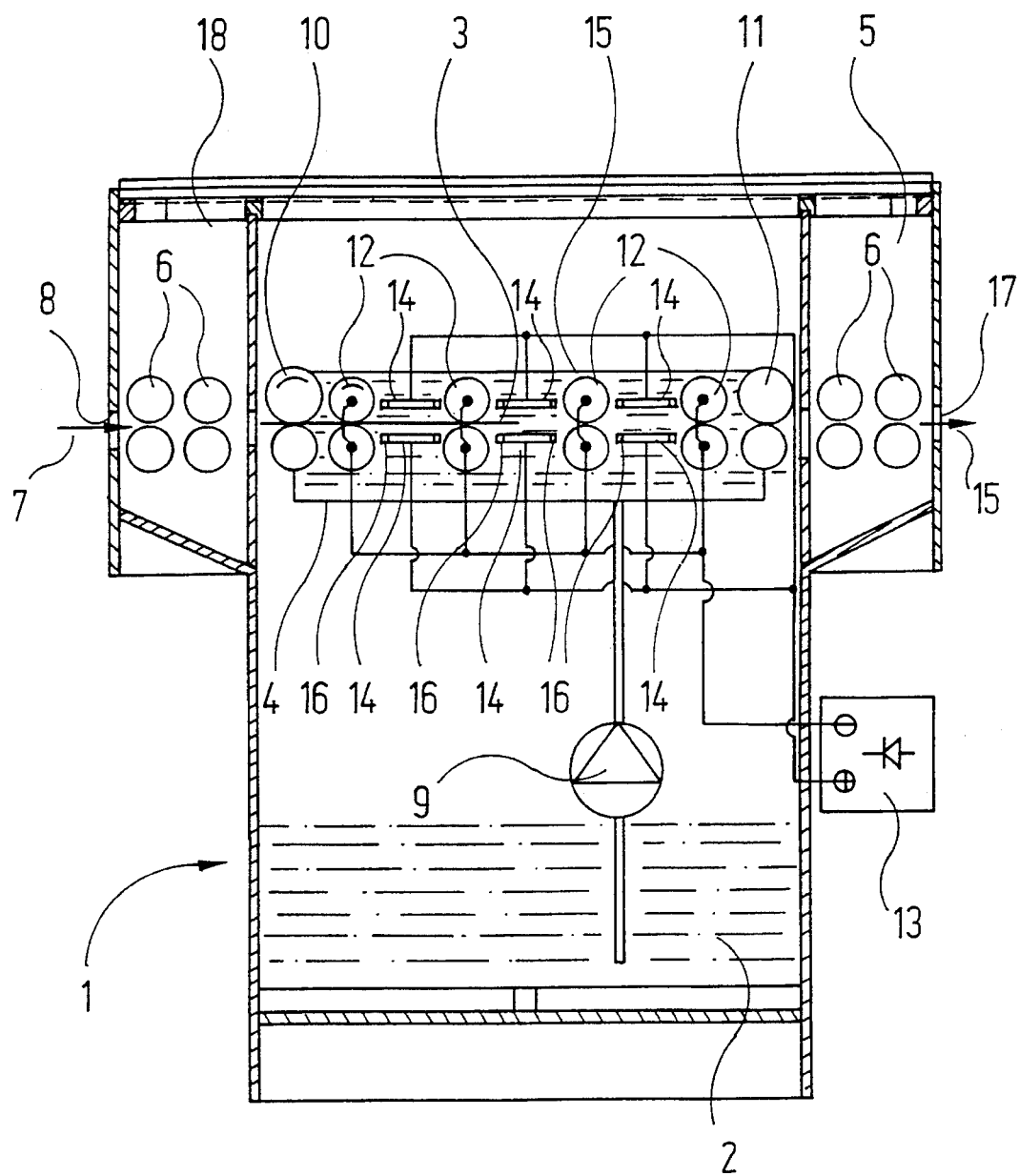

5,556,532

MANUFACTURE OF A MULTILAYER LAMINATE

FIELD OF THE INVENTION

The present invention relates to the production of a multilayer laminate which comprises layers of electrically conducting and insulating materials respectively.

BACKGROUND OF THE RELATED ART

Multilayer laminates are composed of various layers; in those layers, copper laminates alternate with organic insulating materials. The copper laminates, which contain the electrical circuit pattern, are black- or brown-oxidised at the metallic regions for better adhesion to the adjacent insulating layers. When the holes through which the metallic circuit patterns in different layers are connected to one another are being drilled in the assembled multilayers, slight damaging of the bond between the copper laminates and the adjacent insulating layers may occur in the region of those drill-holes because of mechanical or thermal effects. When the copper laminates are then subjected to an acid treatment to clean the walls of the drill-holes and in preparation for the subsequent metallisation, the acid can penetrate into the weakened joins between copper laminate and adjacent insulating layer and dissolve the copper oxide relatively rapidly. The acid is then able to advance further into the layer structure along the copper oxide layer; salt residues deposited there may result in short-circuits between the conductors. This phenomenon can be detected externally by the formation of rings around the drill-holes in the copper laminates, which rings appear pink and are therefore referred to among experts as "pink rings". The expression "pink rings" is understood as meaning a phenomenon in electrical multilayers that impairs their appearance and gives rise at least to doubts as to their ability to function and their reliability.

In order to avoid the formation of such pink rings and the adverse acid effects of which the pink rings are an indication, it is known to reduce the copper oxide on the metallic surfaces of the black- or brown-oxidised copper laminates by chemical reducing agents. The reduction generally takes place only partially, either to metallic copper or to monovalent copper, but with the desired adhesion-improving surface structure of the copper laminates being retained. The reduced surface layer cannot be attacked by the acid used in the subsequent process steps or, at all events, can no longer be attacked so rapidly.

The known reduction of the copper oxide on black- or brown-oxidised copper laminates which is effected by chemicals has a number of disadvantages. The reducing chemicals used are relatively expensive, and they become spent in the course of time. Furthermore, the chemical reduction takes a relatively long time: the reaction starts only with a certain delay after placing the copper laminates in the solution of the reducing agent. The long period of time required for the chemical reduction process is reflected in terms of the apparatus in long modules in which this process step is carried out. Both the costs of the chemicals used and the costs of the module are, therefore, relatively high. The running consumption costs required for the reduction are therefore significant.

BRIEF DESCRIPTION OF THE DRAWING

The sole FIGURE of the drawing is a vertically sectioned schematic view of the preferred embodiment of the apparatus.

SUMMARY OF THE INVENTION

The present invention seeks to provide a process and apparatus by which the reduction of the copper oxide on black- or brown-oxidised copper laminates can be carried out more rapidly and more cheaply.

The invention relates to a process for the manufacture of a multilayer laminate which comprises layers of electrically conducting and insulating materials respectively, in which the copper oxide on the metallic regions of black- or brown-oxidised copper laminates is at least partially reduced before their integration into the multilayers in order to avoid the formation of pink rings.

Accordingly, in one aspect, the invention provides a process for the manufacture of a multilayer laminate which comprises layers of electrically conducting and insulating materials respectively, which comprises:

(a) connecting black- or brown-oxidised copper laminates as a cathode exposed to electrolyte in an electrolysis in a treatment chamber inside a housing, and conveying the cathode in horizontal orientation in the electrolyte;

(b) generating hydrogen in statu nascendi at the cathode during electrolysis in the cell by which copper oxide present on metallic regions of the laminates is at least partially reduced to reduce the formation of pink rings, and (c) integrating the laminates into the multilayers.

The electrochemical reduction using atomic hydrogen which, according to the invention, takes place directly at the surfaces to be reduced, does not require expensive chemicals; electrolytes that generate hydrogen cathodically during electrolysis are readily available in a wide range at very low cost. It is furthermore found that the electrochemical reduction can take place extremely rapidly and, therefore, the residence time of the copper laminates in the electrolysis can be kept relatively short. At suitable current densities, a few seconds are perfectly adequate.

As the electrolyte it is possible to use, in particular, a salt solution, especially a solution of sodium hydroxide or of a common salt, especially a sodium chloride solution.

The current density during the electrolysis should be maintained at from 1 to 500, preferably from 10 to 250, $mA.cm^{-2}$. The current density suitable for the particular application can be determined within that range by a few tests. The current densities should, of course, remain as low as possible.

In principle, it is possible to carry out the reduction entirely without the use of special reducing chemicals. In certain cases, however, in order to accelerate the process further, it may be advisable to expose the copper laminates during the electrolysis simultaneously to a chemical reducing agent dissolved in the electrolyte. The amount of chemical reducing agent required in this instance will be very much smaller than in the known processes which do not employ electrochemical reduction.

In a preferred variant of the process, the copper laminates are subjected to a chemical reduction by a reducing agent after an initial electrochemical reduction. It has been found that a very short electrochemical reduction completely eliminates the delay before the start of the reaction which is observed in the case of the purely chemical reduction used hitherto.

In another aspect, the invention provides apparatus for use in the manufacture of a multilayer laminate which comprises layers of electrically conducting and insulating materials respectively, which comprises:

(a) a housing;

(b) a transport system which conveys copper laminates in horizontal orientation through the apparatus;

(c) a device for at least partially reducing the copper oxide on the metallic regions of the black- or brown-oxidised copper laminates before their integration into the multilayers, in order to reduce the formation of pink rings, the device comprising (i) a treatment chamber which, with the inflow and the outflow in dynamic equilibrium, can be filled to a predetermined level with an electrolyte that generates hydrogen in the electrolysis, the copper laminates being passed by the transport system through the treatment chamber below the level of the electrolyte, (ii) a voltage source, (iii) at least one contacting device which is arranged inside the treatment chamber, extends over the entire width of the copper laminates perpendicular to the direction of movement thereof, and is connected to the negative pole of the voltage source, and (iv) at least one anode which is arranged in the vicinity of the movement path of the copper laminates and is connected to the positive pole of the voltage source.

The advantages of the apparatus according to the invention are accordingly consistent with the above-described advantages of the process according to the invention; the shorter reduction time which can be achieved according to the invention is reflected in a reduced length of the apparatus with the same output or, with the same length, in an increase in output.

For reasons of geometry it is generally advisable for a plurality of contacting devices and anodes to be arranged one behind another in the direction of movement of the copper laminates.

The distance between adjacent contacting devices should be smaller than the length, preferably smaller than half the length, of the copper laminates. In that way, the copper laminates remain connected as cathodes throughout their passage through the treatment chamber; at the given smaller spacing, it is also ensured that the copper laminates are always supported at two points and are therefore less able to escape from the prescribed path, which might lead to short-circuits.

If the anode(s) is (are) arranged between the contacting devices, for reasons of geometry they may be brought relatively close to the passing copper laminates, with the result that only low voltages are required.

With this embodiment of the apparatus according to the invention, it is advisable for the anode or anodes to be electrically insulated on the sides not facing the movement path of the copper laminates. This prevents direct electrolysis between the anodes and the contacting devices without the copper laminates being included.

In an especially preferred embodiment of the apparatus according to the invention, each contacting device is formed by a contact roller in each case.

Alternatively, brushes or brush curtains are suitable as the or each contacting device.

The remarks made above regarding the electrolyte in connection with the process are applicable analogously to the apparatus according to the invention.

In a further example embodiment of the invention, there is arranged downstream of the first treatment chamber in the direction of movement of the copper laminates a second treatment chamber in which the copper laminates can be exposed to a solution of a chemical reducing agent. This construction is chosen when the electrochemical reduction is intended to accelerate a subsequent, purely chemical, reduction.

DESCRIPTION OF PREFERRED EMBODIMENTS

The invention is described in detail below with reference to the drawing, in which the single FIG. shows a longitudinal section through that part of an apparatus for the manufacture of multilayers in which the oxide layer on the black- or brown-oxidised copper laminate in reduced in order to avoid "pink rings".

The apparatus shown in the drawing is part of a production line in which multilayers are manufactured. In accordance with the various process steps, the entire production line is assembled in modular form. Accordingly, there is to be imagined upstream of the apparatus shown a module in which the copper laminates, which will be joined together to form the multilayers in a later process step, are black- or brown-oxidised. Arranged downstream of the apparatus shown are, for example, rinsing modules and the apparatuses in which the individual laminates are joined together to form finished multilayers.

The apparatus shown in the drawing comprises a housing 1 in the base region of which a sump 2 for an electrolyte is formed. The electrolyte in question may be, for example, 5% sodium hydroxide. Any electrolyte that generates hydrogen electrolytically at cathodically connected copper and is in other respects compatible with the materials of the apparatus is suitable. In principle, salt solutions, especially NaCl solutions, would be suitable; in that case, however, special precautions would have to be taken to avoid chlorine formation.

The copper laminates 3, which have been black- or brown-oxidised in the preceding process step, enter the housing 1 in the direction of the arrow 7 through an entry slot 8. In so doing, they are moved in a horizontal orientation by a conveying system which consists, for example, of a plurality of roller pairs 6. Two such roller pairs 6 are shown in an inlet part 18 of the housing 1. A special guide system, which is not shown in the drawing but is known per se (see, for example, DE-A-2851510), ensures that the copper laminates do not bend outwards but remain substantially in the transport plane.

From the inlet part 18 of the housing 1, the copper laminates 3 pass into the interior of a tank 4 forming a treatment chamber, the front end wall of which, viewed in the direction of movement of the copper laminates 3, is formed by a pair of dam rollers 10 and the rear end wall of which, viewed in the direction of movement, is formed by a pair of dam rollers 11. The copper laminates 3 move through the gap between the pair of dam rollers 10 into the interior of the tank 4 and are there seized by pairs of contact rollers 12 which, besides having the function of a contacting device, which is yet to be described, at the same time perform the role of the transport system inside the tank 4. For the reasons given above, they may be equipped with the same guide system as the roller pairs 6. The contact roller pairs 12 are electrically connected to the negative pole of a voltage source 13.

Between successive pairs of contact rollers 12 in the direction of transport, plate-shaped anodes 14 are arranged in a chamber 15 above and below the movement path of the copper laminates 3, which anodes are connected to the positive pole of the voltage source 13. They carry on the sides facing the contact roller pairs 12 and on the rear side an electrical insulation 16. This insulation prevents direct electrolysis between the anodes 14 and the adjacent contact roller pairs 12.

The copper laminates 3 leave the tank 4 through the gap between the pair of dam rollers 11, are gripped by roller pairs 6 in an outlet part 5 of the housing 1, and leave the housing 1 via an exit slot 17 from whence they are conveyed to the downstream module, for example a rinsing module.

A pump 9 takes electrolyte from the sump 2 of the housing 1 and feeds it from below into the interior of the tank 4. With a dynamic equilibrium between the electrolyte supplied and the electrolyte overflowing and leaving the tank and returning to the sump 2, the electrolyte finds, as shown schematically in the drawing, a stationary level 15 inside the tank 4 at the height of an overflow channel, not shown. This kind of dynamic damming of a treatment liquid is known amongst experts as a "standing wave".

The apparatus described operates as follows:

The black- or brown-oxidised copper laminates entering the electrolyte dammed up in the tank 4 through the gap between the pair of dam rollers 10 pass between the contact roller pairs 12, whereby all of the metallic regions on the upper and lower side are connected to the negative pole of the voltage source 13, that is as the cathode. During passage between the anode plates 14, therefore, there is produced between those anode plates and the passing copper laminates 3 an electric field in which the electrolyte dammed up in the tank 4 is electrolysed. The concentration of electrolyte (for example 5% NaOH) and the voltage of the voltage source 13 are set in such a manner that a current density of some from about 10 to a 200 $mA.cm^{-2}$ (or upto perhaps 400 to 800 $mA.cm^{-2}$) is obtained. On account of this electrolysis, atomic hydrogen initially evolves in statu nascendi at the cathodically connected, surface-oxidised metal regions of the copper laminates 3 and reacts with and reduces the copper oxide on the black- or brown-oxidised copper laminate. The reduction does not need to take place completely; it is sufficient for the divalent copper to be reduced partly to metallic copper and partly to monovalent copper. Excess atomic hydrogen combines in known manner with other hydrogen atoms to form hydrogen molecules which escape as gas.

At the anode plates 14, oxygen evolves. The gases produced during the electrolysis are diluted and disposed of by a suitable air supply and removal system.

The distance between adjacent pairs of contact rollers 12 is correlated with the dimensions of the copper laminates 3 in such a manner that the laminates are at cathodic potential throughout their passage through the tank 4 between the dam roller pairs 10 and 11. Accordingly, an electrolysis and an electrochemical reduction of the copper oxide on the copper laminates 3 take place during virtually the entire passage of the copper laminates 3 between the dam roller pairs 10 and 11.

After only a few seconds, for example after five seconds, the previously black- or brown-oxidised metallic surfaces of the copper laminates 3 have been so reduced or passivated that they have a very much higher resistance value in a subsequent acid treatment, for example are eroded only after six times the exposure time.

The duration of treatment is set, at a given transport speed, by the length of the tank 4, viewed in the direction of movement. In comparison with conventional modules, in which the reduction of the copper oxide layer is effected purely by chemical means, it can be kept considerably shorter.

Under certain conditions, it is also possible to add a chemical reducing agent to the electrolyte present in the sump 2 and in the tank 4. The electrochemical reduction forms in this case a kind of "starter" which accelerates the onset of the purely chemical reduction reaction. Alternatively, it is also possible to arrange downstream of the apparatus shown, which reduces exclusively electrochemically, a second module in which the pre-reduced copper laminates 3 are passed through a chemical reducing bath as is known per se.

In the case of the apparatus described in detail above, the contacting devices were in the form of contact rollers. Brushes or brush curtains can also be used instead.

Although the present invention has been described and illustrated in detail, it should be clearly understood that the same is by way of illustration and example only and is not to be taken by way of limitation, the spirit and scope of the present invention being limited only by the terms of the appended claims.

What is claimed is:

1. A process for the manufacture of a multilayer laminate which comprises layers of electrically conducting and insulating materials respectively, which comprises:

(a) connecting black- or brown-oxidised copper laminates as a cathode exposed to electrolyte in an electrolysis cell in a treatment chamber inside a housing, and conveying the cathode in horizontal orientation in the electrolyte;

(b) generating hydrogen in statu nascendi at the cathode during electrolysis in the cell by which copper oxide present on metallic regions of the laminates is at least partially reduced to reduce the formation of pink rings; and (c) integrating the laminates into the multilayers.

2. A process as claimed in claim 1, in which the electrolyte present in the electrolysis cell comprises a salt solution.

3. A process as claimed in claim 2, in which the electrolyte comprises a solution of sodium chloride.

4. A process as claimed in claim 1, in which the electrolyte present in the electrolysis cell comprises dilute NaOH.

5. A process as claimed in claim 1, in which the current density during the electrolysis is maintained at from 1 to 500 $mA.cm^{-2}$.

6. A process as claimed in claim 5, in which the current density during the electrolysis is maintained at from 20 to 250 $mA.cm^{-2}$.

7. A process as claimed in claim 1, in which the copper laminates are exposed, during the electrolysis, to a chemical reducing agent dissolved in the electrolyte.

8. A process as claimed in claim 1, which includes the step of subjecting the copper laminates to a chemical reduction by a reducing agent, after the electrochemical reduction step.

9. Apparatus for use in the manufacture of a multilayer laminate which comprises layers of electrically conducting and insulating materials respectively, which comprises:

(a) a housing;

(b) a transport system which conveys copper laminates in horizontal orientation through the apparatus;

(c) a device for at least partially reducing the copper oxide on the metallic regions of the black- or brown-oxidised copper laminates before their integration into the multilayers, in order to reduce the formation of pink rings, the device comprising (i) a treatment chamber which, with the inflow and the outflow in dynamic equilibrium, can be filled to a predetermined level with an electrolyte that generates hydrogen in the electrolysis, the copper laminates being passed by the transport system through the treatment chamber below the level of the electrolyte, (ii) a voltage source, (iii) at least one contacting device which is arranged inside the treatment chamber, extends over the entire width of the copper laminates perpendicular to the direction of movement thereof, and is connected to the negative pole of the voltage source, and (iv) at least one anode which is arranged in the vicinity of the movement path of the copper laminates and is connected to the positive pole of the voltage source.

10. Apparatus as claimed in claim 9, which comprises a plurality of contacting devices and anodes arranged one behind another in the direction of movement of the copper laminates.

11. Apparatus as claimed in claim 10, which includes copper laminates to be subjected to the reduction in the said device, and in which the distance between adjacent contacting devices is smaller than the length of the copper laminates.

12. Apparatus as claimed in claim 11, in which the distance between adjacent contacting devices is smaller than half of the length of the copper laminates.

13. Apparatus as claimed in claim 9, in which each anode is arranged between a pair of contacting devices.

14. Apparatus as claimed in claim 13, in which each anode located between a pair of contacted devices is electrically insulated on the sides not facing the movement path of the copper laminates.

15. Apparatus as claimed in claim 9, in which each contacting device has been formed by a contact roller.

16. Apparatus as claimed in claim 9, in which each contacting device is formed by a brush or a brush curtain.

17. Apparatus as claimed in claim 9, in which the electrolyte comprises dilute NaOH.

18. Apparatus as claimed in claim 9, in which the electrolyte comprises a salt solution.

19. Apparatus as claimed in claim 9, in which the electrolyte comprises a sodium chloride solution.

20. Apparatus as claimed in claim 9, in which the electrolyte contains a chemical reducing agent.

21. Apparatus as claimed in claim 9, which includes a second treatment chamber which is arranged downstream of the first treatment chamber in the direction of movement of the copper laminates, and in which the copper laminates can be exposed to a solution of a chemical reducing agent.

* * * * *